United States Patent [19]

Blitshteyn

[11] Patent Number: 4,529,940
[45] Date of Patent: Jul. 16, 1985

[54] PANORAMIC ELECTROSTATIC FIELD SENSOR

[75] Inventor: Mark Blitshteyn, North Wales, Pa.

[73] Assignee: The Simco Company, Inc., Hatfield, Pa.

[21] Appl. No.: 449,405

[22] Filed: Dec. 13, 1982

[51] Int. Cl.³ .................................. G01R 29/12
[52] U.S. Cl. ............................ 324/458; 324/109
[58] Field of Search ............ 250/231 SE; 324/72, 324/72.5, 457, 458, 175, 109

[56] References Cited

U.S. PATENT DOCUMENTS

| | | | |
|---|---|---|---|
| 1,919,215 | 7/1933 | Gunn | 324/109 |
| 2,745,062 | 5/1956 | Medicus | 324/109 |
| 2,980,855 | 4/1961 | Moore | 324/458 |
| 3,458,805 | 7/1969 | Kasemir | 324/458 |
| 4,054,835 | 10/1977 | Los et al. | |
| 4,379,221 | 4/1983 | Avins et al. | 250/231 SE |

Primary Examiner—Michael J. Tokar
Assistant Examiner—Kevin D. O'Shea
Attorney, Agent, or Firm—Stanley Bilker

[57] ABSTRACT

A panoramic electrostatic field sensor includes a central monitoring electrode for detecting an electrostatic field oriented about a 360° arc peripheral thereto. An apertured housing is concentrically arranged about the monitoring electrode, the housing having circumferentially spaced windows through which the central electrode can "see" any electrostatic field radially disposed with respect to the sensor. A cylindrical shielding cap is rotated in the annular space between the monitoring electrode and the housing, the cap incorporating at least one slot to expose the monitoring electrode periodically to any fields viewed through the housing windows. Electronic means for measuring the voltage in response to the field detected is adapted to activate a static neutralizer for emission of positive and negative ions into the field or to actuate a variety of peripheral indicating or triggering devices which provide signals, alarms or readout functions.

10 Claims, 6 Drawing Figures

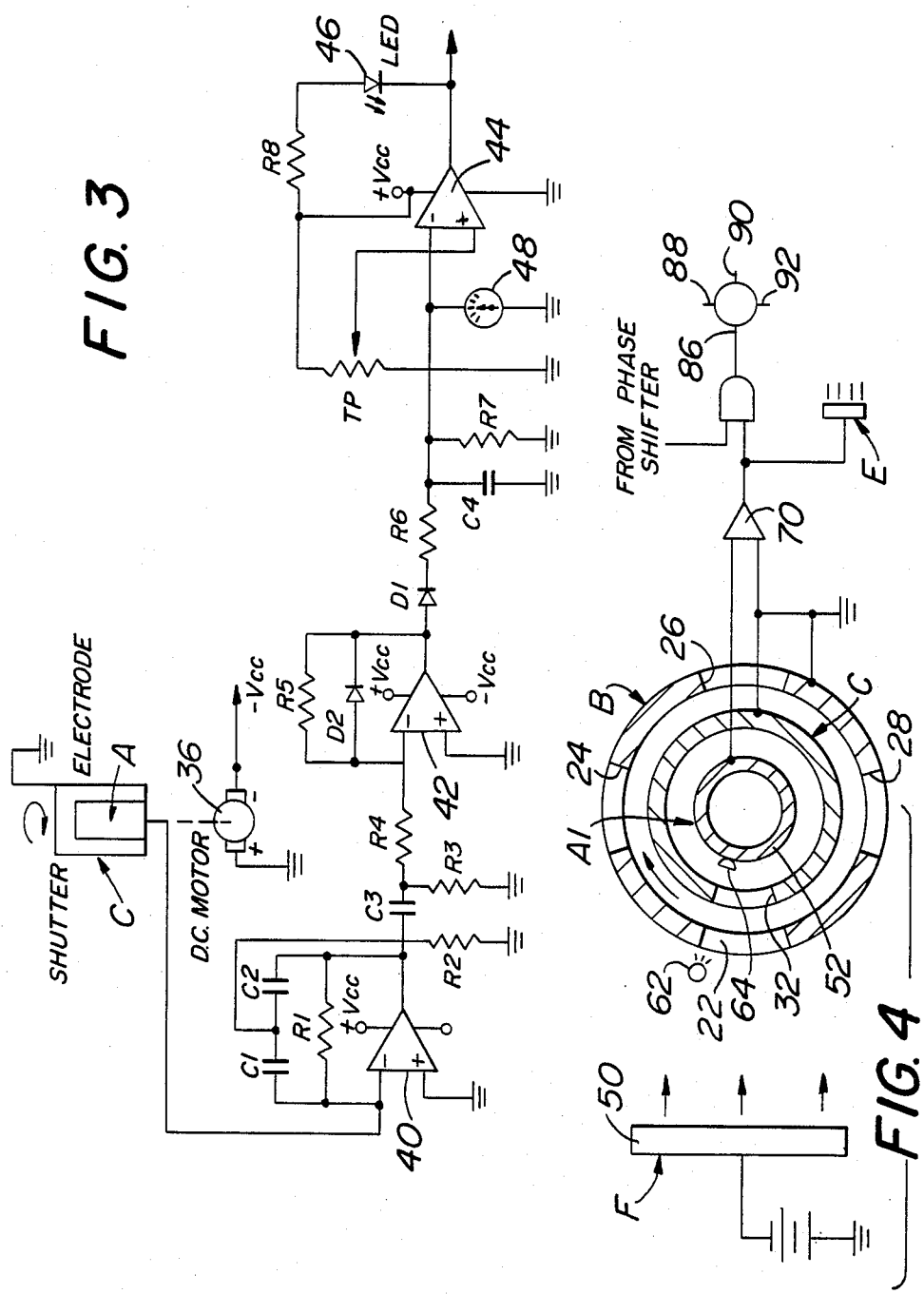

PANORAMIC ELECTROSTATIC FIELD SENSOR

BACKGROUND OF THE INVENTION

1. Field of the Invention

This invention relates to electrostatic field detection systems and more particularly relates to apparatus for panoramically sensing and monitoring electrostatic fields oriented about a 360° arc with respect to the site of the detection device. The instant invention generally pertains to mechanical modulation systems and is especially concerned with a panoramic sensor in which a rotary chopper is interposed between a stationary circumferentially apertured housing and a fixed centrally disposed field detecting element.

2. Prior Art

Almost all systems for detecting and continuously monitoring electrostatic fields include mechanical modulation arrangements. Sensing electrodes convert the electrostatic field or surface potential being monitored into an AC voltage, the magnitude of which is proportional to the detected field or potential. This conversion is accomplished by a capacitive modulation process in which the capacitive coupling between the sensing electrode and the ambient electrostatic field is modulated or varied mechanically at a fixed periodic rate. In some of the prior art field sensing devices, the electrostatic field being monitored passes through a slotted disk or rotary chopper blades, the field being interrupted as ground segments and open segments alternately pass in front of one or more sensing electrodes. See U.S. Pat. No. 3,846,700 or No. 4,055,798 wherein the sensing electrodes behind the disk or chopper produce an electrical signal output when the field falls on the sensing plates and a reverse electrical signal output when the field is interrupted by the disk or chopper. The intensity of the field is related to the amplitude of the output signal and the polarity of the field may be indicated by the phase of the output signal. Another type of field sensor, such as shown in U.S. Pat. No. 4,205,267, utilizes an electrode which is contained in a windowed housing and is itself mechanically vibrated in a plane parallel to the test surface so as to expose the sensing electrode periodically to the field through the window. Still another system, such as is illustrated in U.S. Pat. No. 3,370,225, employs a fixed electrode behind an apertured housing and includes a shutter mechanically vibrated in a plane parallel to a fixed electrode.

However, in none of the foregoing systems are the devices capable of continuously monitoring and sensing panoramically electrostatic fields disposed circumferentially about 360° of arc around the site of the sensor itself. While it is conceivable that the prior art unidirectional detecting devices could be mounted on a rotating platform to measure the electrostatic fields in azimuth, there is no suggestion in the prior art to accomplish that purpose, and it would require expensive auxilliary turntables to achieve such a result. For example, where work is being performed in a room where minimal electrostatic charging environment is required, it is desirable to monitor all areas of that room to insure that personnel or articles entering the area from any part of that room and carrying charge be detected immediately and neutralized as quickly as possible by static elimination equipment.

SUMMARY OF THE INVENTION

It is therefore an object of this invention to provide electrostatic field detection apparatus which will continuously monitor panoramically all areas located in a 360° arc around the site of the detection apparatus.

Another object of this invention is to provide a panoramic electrostatic field detection device which may be conveniently located at any area for rapidly sensing the magnitude of electrostatic charges or fields peripheral to the site location.

Another object of this invention is to provide an electrostatic field sensor which is capable of identifying the location of the electrostatic field in reference to the sensor.

Yet still another object of this invention is to provide a panoramic field detection device which is compact and unobtrusive.

Yet a further object of this invention is to provide a panoramic field detection apparatus which can actuate a variety of peripheral indicating, readout or signaling devices.

Other objects of this invention are to provide an improved device of the character described which is easily and economically produced, sturdy in construction and both highly efficient and effective in operation.

In accordance with the present invention, there is provided a panoramic field sensor which includes a central monitoring electrode for detecting an electrostatic field oriented about a 360° arc peripheral with respect to the sensor. An apertured housing is concentrically arranged about the monitoring electrode, the housing having circumferentially spaced windows through which the central electrode can "see" any electrostatic field radially disposed with respect to the sensor. A cylindrical shielding cap or shutter is rotated in the annular space between the monitoring electrode and the housing, the cap incorporating a slot to expose the monitoring electrode periodically to any fields viewed through the housing windows. The cyclical exposure of the monitoring electrode with respect to the external electrostatic charge or field provides a variation in the capacitive coupling between the electrode and such external field. This results in a periodic signal which is then applied to the input of an amplifier whose output signal is a measure of the intensity of the electrostatic field. Means are provided to determine the exact location of the electrostatic charge or field with respect to the sensor. Means responsive to the field detected are also provided for actuating, for example, a static neutralizer which emits positive and negative ions into the field.

Another form of the invention contemplates the use of a metering device or audible or visible indicator to provide a relative measure of the field. The monitoring electrode may either comprise a plurality of peripherally spaced sensing elements in registration with the housing windows or a single continuous cylindrical element. In the latter instance, a position sensor, such as an optical beam and photocell, is required to synchronize the angular displacement of the rotary cap with respect to the arcuate position of the housing windows in order to identify the location of the external field.

DESCRIPTION OF THE FIGURES

FIG. 3 is an electrical schematic diagram of the electronic circuitry employed in the embodiment of FIG. 1.

FIG. 4 is a sectional view showing a modification of the panoramic field sensor.

DETAILED DESCRIPTION

Figure 1:
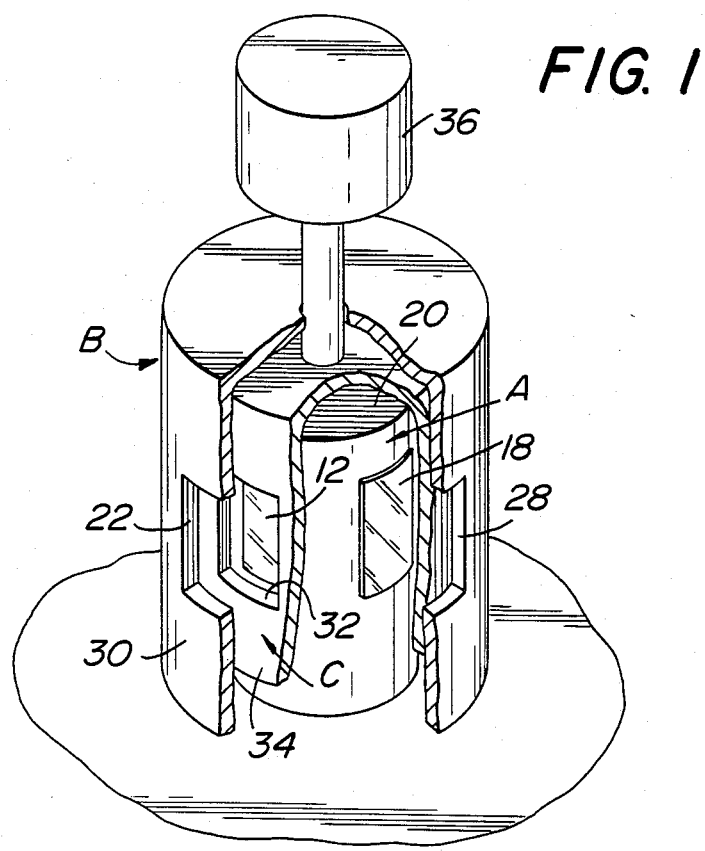
FIG. 1 is a perspective view, partly broken away, of a panoramic field sensor embodying this invention.
Figure 2:
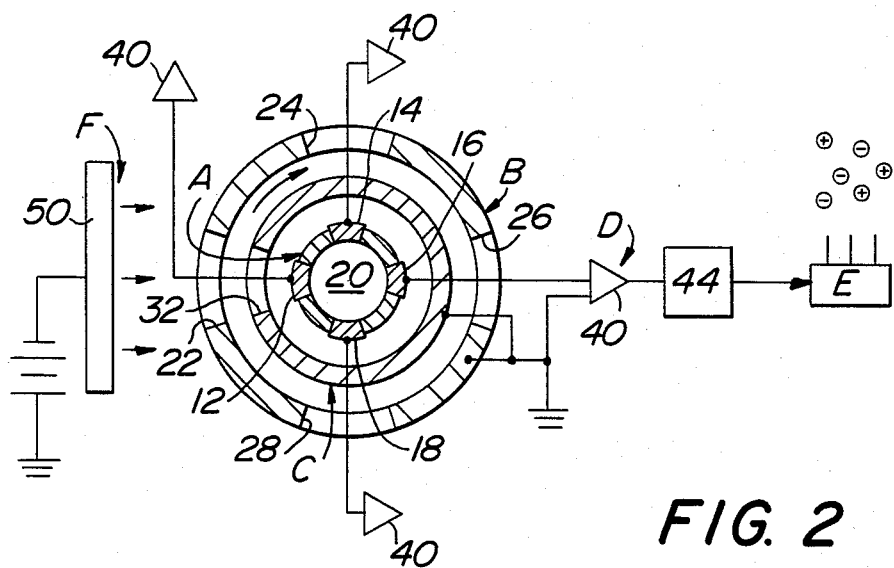
FIG. 2 is a sectional view taken along lines 2—2 of FIG. 1 and including a block diagrammatic representation of the electronic circuitry.

Referring now in greater detail to the drawings in which similar reference characters refer to similar parts, there is shown in FIGS. 1, 2 and 3 one embodiment of a panoramic electrostatic field sensor comprising a central monitoring electrode, generally designated as A, an apertured housing B concentrically spaced about the axis of electrode A and a slotted shutter cap or chopper C rotatable in the annular space between the stationary housing B and fixed electrode A. An electronic circuit D measures the voltage detected by the monitoring electrode, amplifies the signal developed thereby and generates an output for actuating a peripheral indicating or triggering device which provides a visible or audible signal or readout or which causes the activation of a static eliminator E to effect emission of both positive and negative ions into the environment when a sensed charge field F exceeds a predetermined level.

The central electrode A comprises a plurality of circumferentially spaced conductive elements 12, 14, 16 and 18 mounted upon an insulated core 20. The conductive elements or segments may be fabricated of any suitable conductive material, such as metal, preferably brass, and may be of any generally regular geometric shape, for example, rectangular, circular or ovate. In the embodiment shown in FIGS. 1 and 2, the sensing elements are oriented at the four quadrants of the fixed core 20 and insulated from ground.

The outer housing B is also made of a conductive material, such as brass or copper, and, as shown in FIGS. 1 and 2, is of a generally cylindrical shape. The housing B is stationary and is concentrically spaced about the axis of the monitoring electrode A. Open windows 22, 24, 26 and 28 are peripherally spaced about the cylindrical wall 30 of housing B and are in radial alignment with the sensing elements 12, 14, 16 and 18. The windows are preferably of a configuration to correspond to the sensing elements, the number of windows being equal to the number of sensing elements. The casing 30 of housing B is electrically grounded.

The rotary cap c is also of a conductive material, preferably brass, and constitutes a grounded cylinder with a slot or elongate port 32 in its cylindrical wall 34 which is adapted to sequentially register with the housing windows 22, 24, 26 and 28 so as to act as a shutter therefor. The cap slot 32 should be equal in size and correspond in shape to the housing windows. The cap C is journaled in the end walls of housing B and is caused to spin in the annular space between said housing B and central electrode A at about 1,000 RPM by means of motor 36. Thus, cap C defines a chopper which cylically exposes each of the sensing elements 12, 14, 16 and 18 as the slot 32 passes the respective windows 22, 24, 26 and 28. This causes the capacitance between the sensing elements and the field F (as represented by surface 50) to vary. The manner in which the capacitance varies relative to the rotation of the chopper cap C is dependent upon the sizes of the outer housing B, the rotary cap C and the corresponding apertures in each. The wave-forms of the signal on the sensing element exposed to an electrostatic field is determined by the rate of capacitance change dc/dt.

Figure 6:
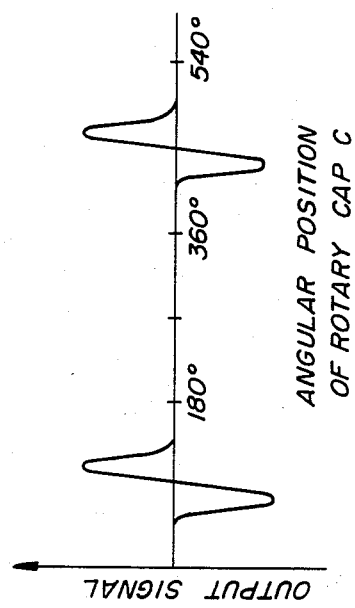
FIG. 6 is a graphical representation of the wave forms developed by the monitored signals.

Refer now to the wave-form of FIG. 6 which graphically depicts the output signal of an amplifier 40 whose input is coupled to sensing element 12 of FIG. 2. The 0° reference corresponds to the position of the leading edge of aperture 32 as it travels clockwise across the right hand edge of window 28 and then passes successively by all four windows in housing B. A signal is produced only when aperture 32 passes across window 22 where the external field represented by surface F is seen. The signal is maximum when dc/dt is maximum. The change in sign of the wave-form occurs where the rotary cap movement changes the capacitance between the sensing element and the electrostatic field from increasing to decreasing. Since there is no electrostatic field viewed through windows 24, 26 and 28, no signal will appear on the other sensing elements 14, 16 and 18.

FIG. 3 is illustrative of one form of electrical circuit for processing the signal from electrode A in the system of FIGS. 1 and 2. Included as part of the electronic circuitry is a high impedance operational amplifier 40 which is coupled by way of its negative input (−) to one of the sensing elements of electrode A, the latter being illustrated diagrammatically in FIG. 3. The positive input (+) of operational amplifier 40 is connected by way of ground to both the housing B and chopper cap C. Feedback resistor R1 is connected between the negative input terminal and the output terminal of amplifier 40. Capacitors C1 and C2 in combination with resistor R2 constitute a bandpass filter.

Capacitor C3 in combination with resistors R3 and R4 couple the output of operational amplifier 40 to the negative input terminal of a second operational amplifier 42. Amplifier 42 along with signal diodes D1 and D2 comprises an amplifier-rectifier circuit which generates positive pulses from the A.C. signals developed by the chopping action of cap C as its slot 32 passes across the view of field F seen by the sensing elements through the corresponding housing windows.

Resistor R6 along with capacitor C4 comprise an integrating circuit which produces a D.C. voltage at the negative input of comparator 44 proportional to the intensity of field F. A reference voltage is applied to the positive input of comparator 44. When the voltage at the negative input of comparator 44 exceeds the reference voltage at its positive input, the comparator switches on and LED 46 lights up. The signal at the output of comparator 44 can then be used to activate external circuits. Potentiometer TP determines the sensitivity range and sets up the threshhold for activating the comparator output. Voltmeter 48 reads the signal voltage and is a measure of the relative field strength. When the output of the comparator 44 exceeds a predetermined level, such output may be utilized to actuate a static neutralizer E for directing ions of both polarities into the environment, as shown in FIG. 2.

Figure 5:
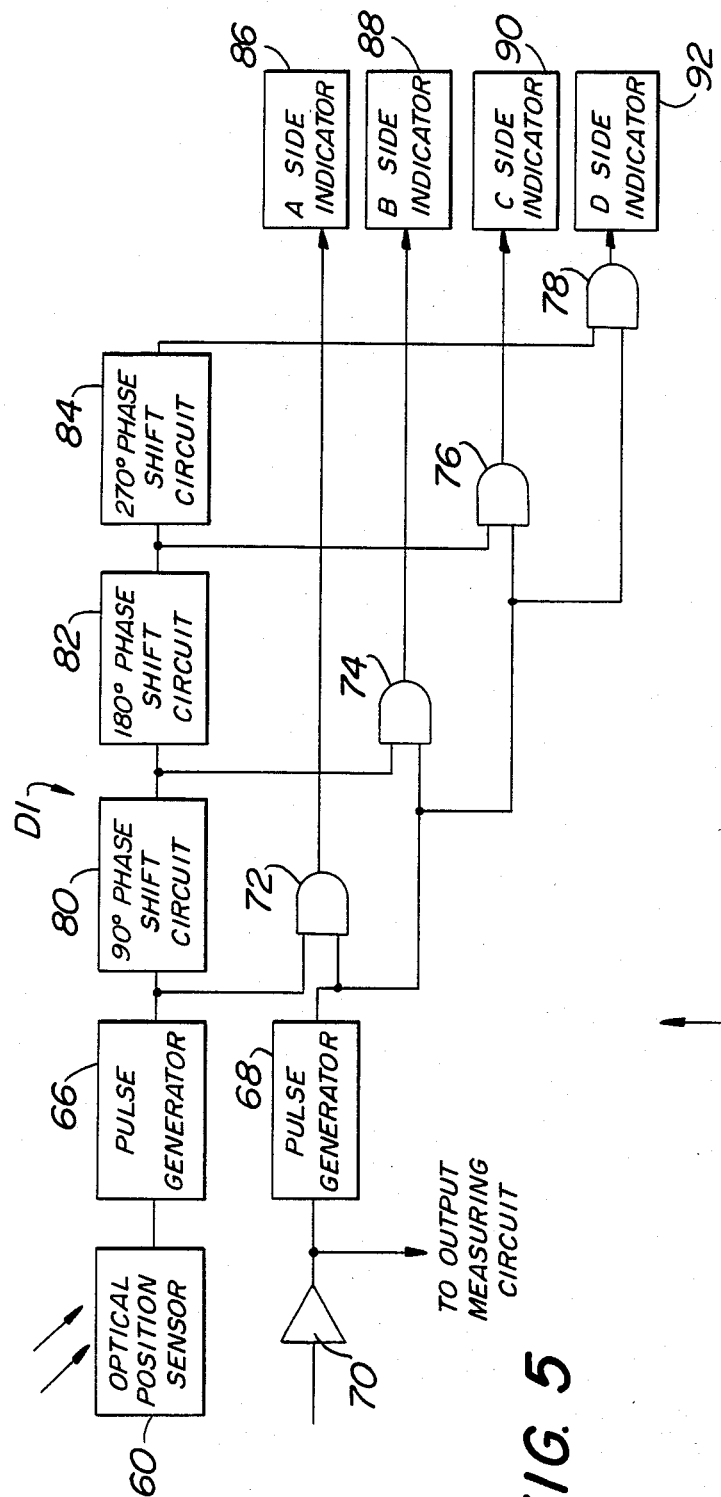
FIG. 5 is a block diagrammatic representation of the synchronizing circuit incorporated in the embodiment of FIG. 4.

Referring now to FIGS. 4 and 5, there is shown a modified form of the electrostatic field sensor wherein the monitoring electrode A1 embodies but a single continuous 360° sensing element 52. Here, just a single electronic circuit is required. However, since the continuous sensing element 52 does not know where the shutter slot 32 is at any particular time, an optical position sensor 60 is employed. The optical position sensor 60 includes a light beam 62 in combination with a photocess 64 which are located at the "zero" position of the panoramic arc. Thus, when the leading edge of slot 32 passes by window 22, the light beam will fall on photocell 64 and produce an output signal for tripping a pulse generator 66. At the same time, a signal from the field F is developed on the monitoring electrode A1 when slot 32 of rotary cap C passes window 22. This signal, if one exists, is amplified by operational amplifier 70 and trips a second pulse generator 68.

The output signal from pulse generator 68, which represents an indication of static charge, is fed as a second input to respective AND gates 72, 74, 76 and 78. Meanwhile, the sequence of pulse generator 66 is directed sequentially to 90° phase shifter 80, then to 180° phase shifter 82, and finally to 270° phase shifter 84. The output signals from the pulse generator 66 and each of the three shift circuits 80, 82 and 84 are supplied as the other inputs to the four AND gates 72, 74, 76 and 78. The existence of static charge in front of any of the housng windows 22, 24, 26 or 28 would accordingly produce a visual and/or sound signal or other readout on the apropriate side indicator 86, 88, 90 or 92 at the respective quadrant. When and if desired, static neutralizers E may be activated for causing emission of positive and negative ions toward the charged zone.

Although this invention has been described in considerable detail, such description is intended as being illustrative rather than limiting since the invention may be variously embodied without departing from the spirit thereof, and the scope of the invention is to be determined as claimed.

What is claimed is:

1. A panoramic electrostatic field sensor comprising:
   central electrode means including circumferentially disposed sensing means thereon for detecting an electrostatic field oriented about a 360° arc peripheral to said central electrode means,
   an apertured housing concentrically arranged about said central electrode means and having a plurality of circumferentially spaced windows therein to permit a panoramic view by said central electrode means of any electrostatic field radially disposed with respect to the sensor,
   a cylindrical chopper cap rotatably supported in the annular space between said central electrode means and said housing an including an opening therein to expose said sensing means periodically to any electrostatic field passing through the housing windows,
   means for rotating said chopper cap so that the opening thereof sequentially passes across the housing windows,
   said sensing means including conducting elements circumferentially spaced about said central electrode means and in alignment with said housing windows, and
   means for measuring the voltage developed by the sensing means in response to the electrostatic field detected.

2. The electrostatic field sensor of claim 1 including electrostatic neutralizing means for emitting positive and negative ions into the environment when the voltage developed by the sensing means exceeds a predetermined level.

3. The electrostatic field sensor of claim 1 wherein said means for measuring comprises an amplifier and an electrical output circuit connected to each conducting element for determining the location of detected electrostatic field in reference to the sensor.

4. A panoramic field sensor comprising;
   central electrode means including circumferentially disposed sensing means thereon for detecting an electrostatic field oriented about a 360° arc peripheral to said central electrode means, said sensing means comprising a single continuous probe element,
   an apertured housing concentrically arranged about said central electrode means and having circumferentially spaced windows therein to permit a panoramic view by said central electrode means of any electrostatic field radially disposed with respect to the sensor,
   a cylindrical chopper cap rotatably supported in the annular space between said central electrode means and said housing and including an opening therein to expose said sensing means periodically to any electrostatic field passing through the housing windows,
   means for rotating said chopper cap so that the opening thereof sequentially passes across the housing windows, including a cap position detector to determine the angular orientation of the opening thereof with respect to each housing window, and
   means for measuring the voltage developed by the sensing means in response to the electrostatic field detected.

5. The electrostatic field sensor of claim 4 wherein said cap position detector is actuated by means comprising an optical sensing element.

6. The electrostatic field sensor of claim 4 wherein said cap position detector comprises an optical sensing element disposed adjacent one of the housing windows and pulse generating means synchonized with the passage of the cap opening past each window and developing phase shift signals corresponding to the angular position of the housing windows to indicate the angular position of said cap opening.

7. The electrostatic field sensor of claim 6 wherein said phase shift signals are applied to selective indicating means to designate the location of the detected electrostatic field in reference to the sensor.

8. The electrostatic field sensor of claim 5 including signal detecting means coupled to the means for measuring the voltage on said sensing means, and
   elecrostatic neutralizing means responsive to said signal detecting means to effect emission of positive and negative ions into the environment.

9. A panoramic electrostatic field sensor comprising:
   central electrode means including circumferentially disposed sensing means thereon for detecting an electrostatic field oriented about a 360° arc peripheral to said central electrode means,
   an apertured housing concentrically arranged about said central electrode means and having circumferentially spaced windows therein to permit a panoramic view by said central electrode means of any electrostatic field radially disposed with respect to the sensor,
   a cylindrical chopper cap rotatably supported in the annular space between said central electrode means and said housing and including an opening therein to expose said sensing means periodically to any electrostatic field passing through the housing windows, means for rotating said chopper cap so that the opening thereof sequentially passes across the housing windows, and means for measuring the voltage developed by the sensing means in response to the electrostatic field detected, including indicating means responsive to said means for measuring to designate the location of any electrostatic field.

10. The electrostatic field sensor of claim 9 including signal detection means responsive to said means for measuring for providing a readout of the voltage on said sensing means.

* * * * *